(12) United States Patent
Pérez De Ayala Rull et al.

(10) Patent No.: US 12,184,247 B2
(45) Date of Patent: Dec. 31, 2024

(54) SWITCHABLE AMPLIFIER

(71) Applicant: OMICRON ELECTRONICS GMBH, Klaus (AT)

(72) Inventors: Pedro Pérez De Ayala Rull, Madrid (ES); Patrick Denz, Hohenems (AT)

(73) Assignee: OMICRON ELECTRONICS GMBH, Klaus (AT)

( * ) Notice: Subject to any disclaimer, the term of this patent is extended or adjusted under 35 U.S.C. 154(b) by 143 days.

(21) Appl. No.: 17/916,151

(22) PCT Filed: Apr. 2, 2021

(86) PCT No.: PCT/EP2021/058791
§ 371 (c)(1),
(2) Date: Sep. 30, 2022

(87) PCT Pub. No.: WO2021/198505
PCT Pub. Date: Oct. 7, 2021

(65) Prior Publication Data
US 2023/0138101 A1 May 4, 2023

(30) Foreign Application Priority Data
Apr. 3, 2020 (AT) .............. A 50287/2020

(51) Int. Cl.
*H03F 3/217* (2006.01)
*G01R 31/327* (2006.01)
(52) U.S. Cl.
CPC ......... *H03F 3/2178* (2013.01); *G01R 31/327* (2013.01); *H03F 3/2173* (2013.01); *H03F 2200/171* (2013.01); *H03F 2200/267* (2013.01)
(58) Field of Classification Search
CPC ........... H03F 3/2178; H03F 3/2173; H03F 2200/171; H03F 2200/267; G01R 31/327
(Continued)

(56) References Cited

U.S. PATENT DOCUMENTS 4,322,766 A * 3/1982 Becker .............. H02H 7/16
361/87
5,444,417 A 8/1995 Botti et al.
(Continued)

FOREIGN PATENT DOCUMENTS

CN 107015081 8/2017
CN 206725674 12/2017
(Continued)

OTHER PUBLICATIONS

Austria Search Report conducted in counterpart Austria Appln. No. A 50287/2020 (Apr. 3, 2020).
(Continued)

*Primary Examiner* — Alexander Satanovsky
*Assistant Examiner* — Trung Q Nguyen
(74) *Attorney, Agent, or Firm* — GREENBLUM & BERNSTEIN, P.L.C.

(57) ABSTRACT

To provide a lightweight and robust voltage amplifier and current amplifier for a test device for testing an electrical component, an amplifier is designed to output a test signal at a signal output between a positive output terminal and a negative output terminal. The amplifier includes a first half bridge and a second half bridge. A switching unit is provided, which is designed to connect the first half bridge and the second half bridge in parallel to the signal output in a first operating mode and to connect the first half bridge and the second half bridge in series with the signal output in a second operating mode.

10 Claims, 6 Drawing Sheets

(58) Field of Classification Search
USPC .. 324/415, 437, 425–435, 126, 756.05, 538, 324/200, 207.13, 233, 256, 515, 500–530, 324/76.11
See application file for complete search history.

(56) References Cited

U.S. PATENT DOCUMENTS

| | | | |
|---|---|---|---|
| 5,621,352 A | 4/1997 | Botti et al. | |
| 10,516,298 B2 * | 12/2019 | Buker | H04B 5/79 |
| 2014/0146573 A1 * | 5/2014 | Yan | H02M 3/33573 |
| | | | 363/17 |
| 2015/0109055 A1 * | 4/2015 | Botti | H03F 1/0205 |
| | | | 330/251 |
| 2021/0036668 A1 * | 2/2021 | Migliazza | H03F 3/211 |

FOREIGN PATENT DOCUMENTS

| | | |
|---|---|---|
| CN | 109687715 | 4/2019 |
| EP | 0 613 242 | 8/1994 |
| EP | 3 114 763 | 6/2018 |

OTHER PUBLICATIONS

Int'l Search Report (Form PCT/ISA/210) conducted in Int'l Appln. No. PCT/EP2021/058791 (Jun. 23, 2021).
Int'l Written Opinion (Form PCT/ISA/237) conducted in Int'l Appln. No. PCT/EP2021/058791 (Jun. 23, 2021).
Int'l Prelim. Exam. Report (Form PCT/IPEA/409) conducted in Int'l Appln. No. PCT/EP2021/058791 (Oct. 6, 2022).

* cited by examiner

SWITCHABLE AMPLIFIER

The present invention relates to an amplifier for a test device for testing an electrical component, wherein the amplifier is designed to output a test signal at a signal output between a positive output terminal and a negative output terminal, wherein the amplifier comprises a first half bridge and a second half bridge.

Often, test devices are necessary for testing control devices of electromechanical or electronic switching devices. Especially in the field of electrical protection technology and electrical energy supply, testing of the function of switching devices and the control devices thereof is important, and often even mandatory. For example, in electrical medium voltage grids switching devices mounted on masts are often equipped with electromagnetic actuators and connected to control devices via control connections. Usually, a test device is used to simulate the switching device. For this purpose, the switching device and the control connection are separated from the control device, and, instead, a test device is connected to the control device via an adapter cable in order to test the function of said control device. The test device then generates a corresponding electrical test signal which is intended to excite the control device to certain reactions. The reactions are detected and evaluated by the test device.

A test signal is composed of a test current and a test voltage. The test signal can have a high-test voltage, e.g., in the range of 300 V, and a low test current—for example, in the range of 1 A. For this purpose, a voltage amplifier is provided in the test device. Said voltage amplifier is designed to generate a test signal having a high-test voltage and a low-test current. Alternatively, the test signal can also be provided with a high-test current, e.g., in the range of 30 A, and a low-test voltage—for example, in the range of 25 V. For this purpose, a current amplifier is again provided, which is designed to generate a test signal having a high test current and a low-test voltage. Since either a high-test voltage and a low test current or a high test current and a low test voltage are output, a relatively low power output results.

If a current amplifier and a voltage amplifier are provided in a test device, these amplifiers have different, mutually separate, topologies. A special voltage output (comprising a positive voltage output terminal and a negative voltage output terminal) is provided for the voltage amplifier, and a special current output which is separated from the voltage output (comprising a positive current output terminal and a negative current output terminal) is provided for the current amplifier. Since a test signal having simultaneously high-test voltage and high test current is not output either at the current output or at the voltage output, a relatively low power is output at both—at the voltage output and at the current output. Nevertheless, the current amplifier and the voltage amplifier have to be dimensioned so as to be sufficiently robust, in order to be able to output the high test current or the high-test voltage. If a test device has a voltage amplifier and a current amplifier, the test device is not only correspondingly bulky, but also heavy, which naturally has a negative effect on the portability. This is disadvantageous, since a test of control devices of a switching device usually takes place on-site in the field, with the result that a high degree of mobility is desired.

It is an object of the present invention to provide a lightweight and robust voltage amplifier and current amplifier for a test device.

This object is achieved according to the invention by providing a switching unit in the amplifier, wherein the switching unit is designed, in a first operating mode, to connect the first half bridge and the second half bridge in parallel to the signal output, and, in a second operating mode, to connect the first half bridge and the second half bridge in series to the signal output.

The first operating mode is optimized for outputting a test signal having a high-test current, so, the amplifier can be regarded as a current amplifier in the first operating mode. In the first operating mode, the amplifier can thus output a test signal having a high-test current, e.g., in the range of 25 to 50 A, and having a low or negligible test voltage, e.g., in the range of 0 to 25 V, at the signal output, by means of the parallel connection of the first half bridge and the second half bridge.

The second operating mode is optimized for outputting a test signal having a high-test voltage, so, the amplifier can be regarded as a voltage amplifier in the second operating mode. Thus, in the second operating mode, the amplifier can output a test signal having a high-test voltage, e.g., in the range of 50 V-10 kV, and a low and/or negligible test current, e.g., in the range of 0 to 1 A, at the signal output, by means of the connection in series of the first half bridge and the second half bridge.

As a result, by way of the amplifier according to the invention, which is switchable from the first into the second operating mode and vice versa, both a current amplifier and a voltage amplifier are realized, depending on the operating mode. Depending on the operating mode, a test signal having a high-test voltage and a low test current or having a high test current and a low test voltage can be output at a signal output, i.e., between a positive output terminal and a negative output terminal. The amplifier according to the invention thus allows the use of the same signal output in the first and in the second operating mode. In contrast, test devices according to the prior art, i.e., having separate voltage amplifiers and current amplifiers, comprise separate voltage outputs and current outputs. Of course, it is also possible, in the amplifier according to the invention, to provide separate signal outputs for the first and second operating mode, but that would mean additional circuit complexity. Since a common circuit topology is provided, according to the invention, for both operating modes, fewer components are required than in the case of a separated design of a voltage amplifier and current amplifier. The volume and the mass of the switchable amplifier are thus lower, which means a higher degree of portability.

Preferably, the first half bridge comprises a first switching element and a second switching element, connected in series with the first switching element, and the second half bridge comprises a third switching element and a fourth switching element, connected in series with the third switching element. Of course, further switching elements can also be provided in the first and/or second half bridge—for example, in order to increase the power output at the output.

Preferably, the amplifier comprises a first DC voltage source and a second DC voltage source connected in series via a connection point, wherein the first and second half bridges are each connected in parallel to the first and second DC voltage sources which are connected in series, and a connection point of the first switching element and of the second switching element form a first center point, and a connection point of the third switching element and of the fourth switching element form a second center point, wherein the first center point is connected to the positive output terminal.

In the first operating mode, the second center point can be connected to the positive output terminal and disconnected from the negative output terminal, as well as the connection point can be connected to the negative output terminal, in order to connect the first half bridge and the second half bridge in parallel with the signal output. A test signal having a high-test current can thus be output at the signal output.

Furthermore, a filter inductor can be provided at the signal output, the inductance of which is preferably switchable. The filter inductor may be connected in series to the positive output terminal or to the negative output terminal. Preferably, the inductance of the filter inductor is switched to a lower inductance, e.g., 10 µH, in the first operating mode, and to a higher inductance, e.g., 200 µH, in the second operating mode. This can be done via a central tapping of the filter inductor. As a result, in the second operating mode, the ripple of the test signal can be kept small by means of the higher inductance. A filter inductor may be be connected to the signal output only in the first operating mode, and it may be disconnected from the signal output, e.g., bridged, in the second operating mode. In the second operating mode, the test voltage of the test signal is fundamentally regulated, as a result of which, in particular, high-impedance loads can be connected to the signal output. If the filter inductor is connected to the signal output in the second operating mode, the test current of the test signal can be regulated more easily in the second operating mode, since the test current is smoothed by the filter inductor. It is thus possible to operate not only low-impedance loads, but also high-impedance loads, due to the high driving output voltage. The filter inductor is optional, but has a favorable effect on the control behavior and the signal quality of the output signal.

In the second operating mode, the negative output terminal is preferably separated from the connection point and connected to the second center point. The first half bridge and the second half bridge are thus connected in series, and a test signal having a high voltage is output at the signal output.

In the second operating mode, the second center point can be connected to the negative output terminal by a first switch which is actuated by the switching unit.

The amplifier according to the invention can be used in a test device for testing an electrical component—preferably a control device of a switching device—of an electrical switchgear assembly. For this purpose, the test signal can be applied to the electrical component in order to enable a test. The test device can also receive an input signal in order to test the electrical component. However, the function of the electrical component can also be tested independently of the test device.

For example, a test device for testing energy meters can be provided. An energy meter measures a current and a voltage for a predetermined period of time in order to be able to correctly determine the consumed energy. The energy meters usually have a roll counter or deliver counting pulses, e.g., via an LED with, for example, 1,000 pulses/kWh. The accuracy of the energy meter may be evaluated using a test device. This can be achieved in that the amplifier of the test device outputs the test signal in order to simulate currents and/or voltages, e.g., analog secondary variables of current and/or voltage converters, over a predetermined time. These currents and/or voltages, i.e., the test signal, are on the one hand fed to the energy meter, but, on the other, also directly recorded, and the energy actually output is calculated therefrom. In addition to or instead of the recording of the currents and/or voltages, the energy output by the test device can also be recorded directly. The energy meter also determines the energy from the currents and/or voltages, whereupon the energy actually output, i.e., recorded or calculated, is compared with the energy determined by the energy meter. As a result, the accuracy of the energy meter can be determined. The determination itself can take place by means of a comparison unit, which compares the energy output with the determined energy. The comparison unit can be provided on the test device itself, or as an independent component or stand-alone device. Of course, the comparison can also be performed by a user.

Furthermore, a test device comprising an amplifier according to the invention can test a secondary signal of operating means (converter, protection relays) of an electrical system. For this purpose, a test signal is output by the amplifier of the test device, which signal is used as a primary signal. The primary signal is applied to a primary side of the operating means, and, further, the secondary signal is determined on the secondary side of the operating means. The secondary signal can be tested for the correct polarity, the correct level, etc., as a result of which, for example, the secondary-side wiring can be tested. The analysis of the secondary signal can be carried out by an analysis unit which is provided on the test device itself or as an independent component or device. Of course, the analysis can also be carried out by a user.

The present invention is described in greater detail below with reference to FIGS. 1 through 5c, which show, by way of example, advantageous embodiments of the invention in a schematic and non-limiting manner. In the drawings.

Figure 3A:
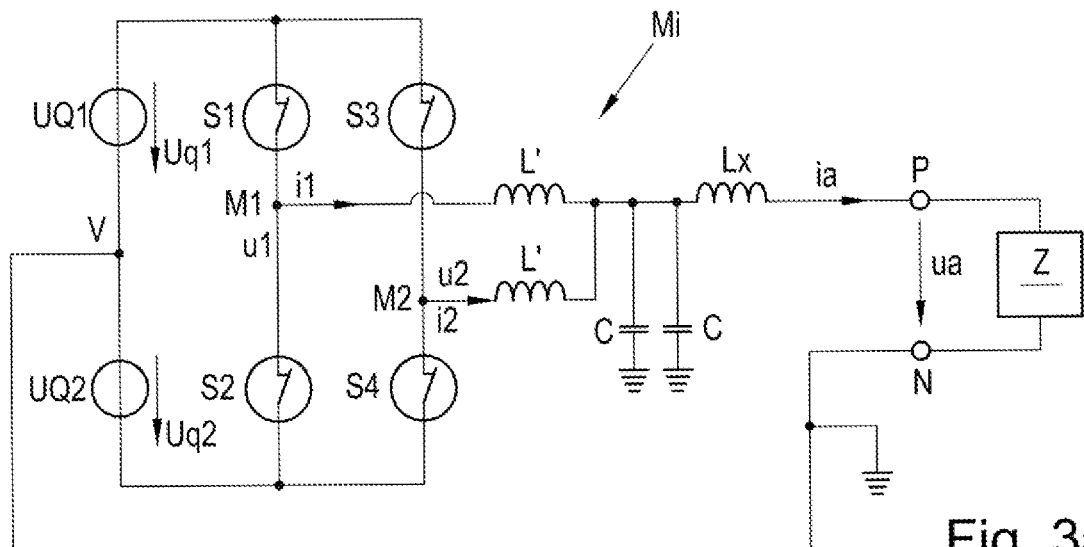
FIG. 3a shows the amplifier in the first operating mode.
Figure 3B:
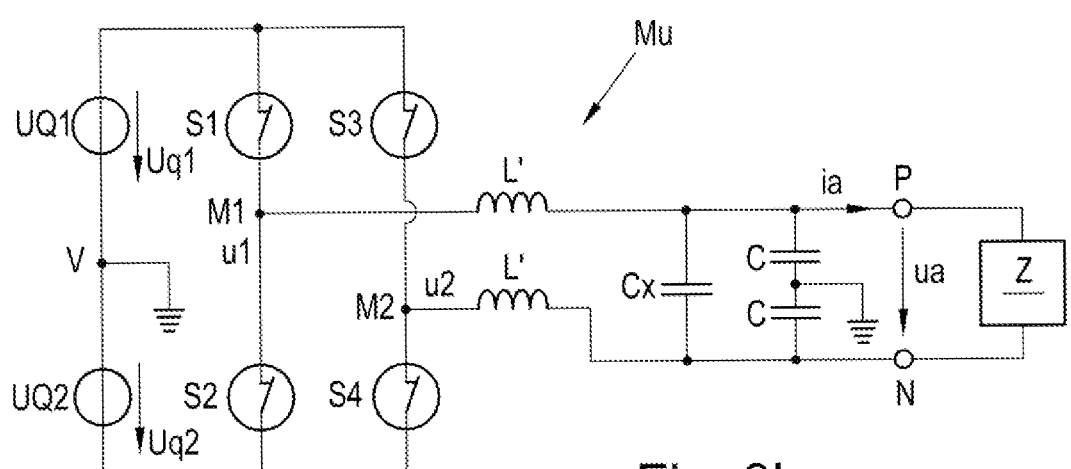
FIG. 3b shows the amplifier in the second operating mode.
Figure 3C:
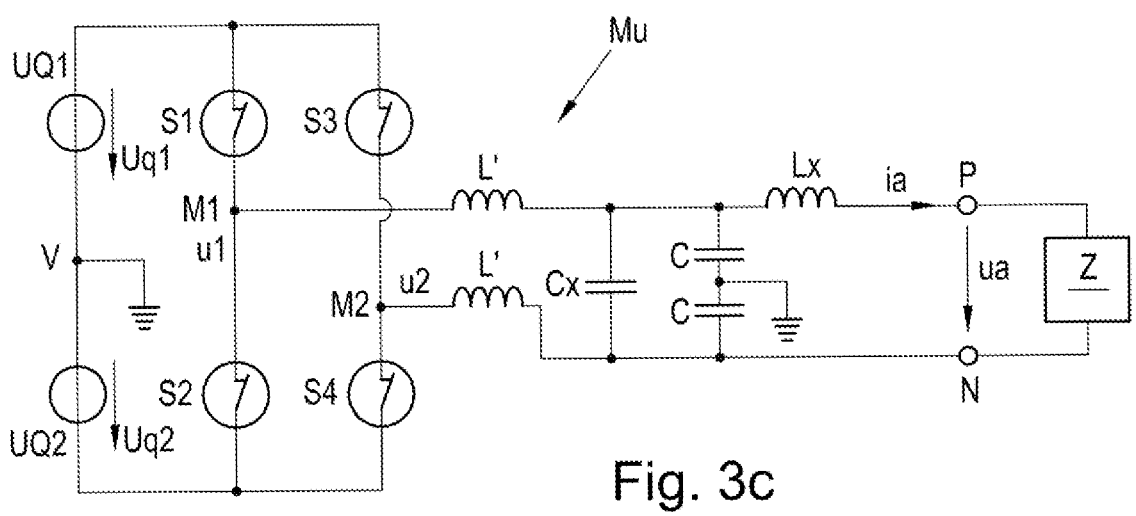
Figure 4A:
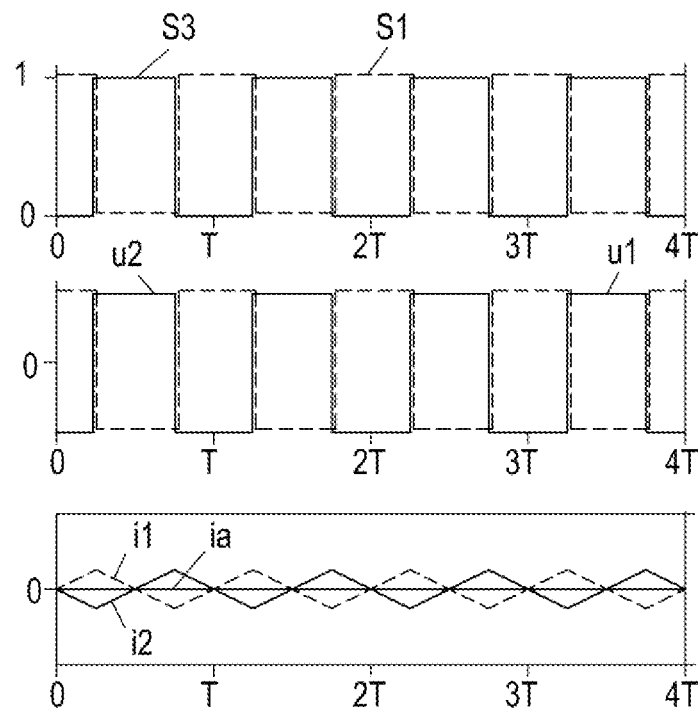
Figure 4B:
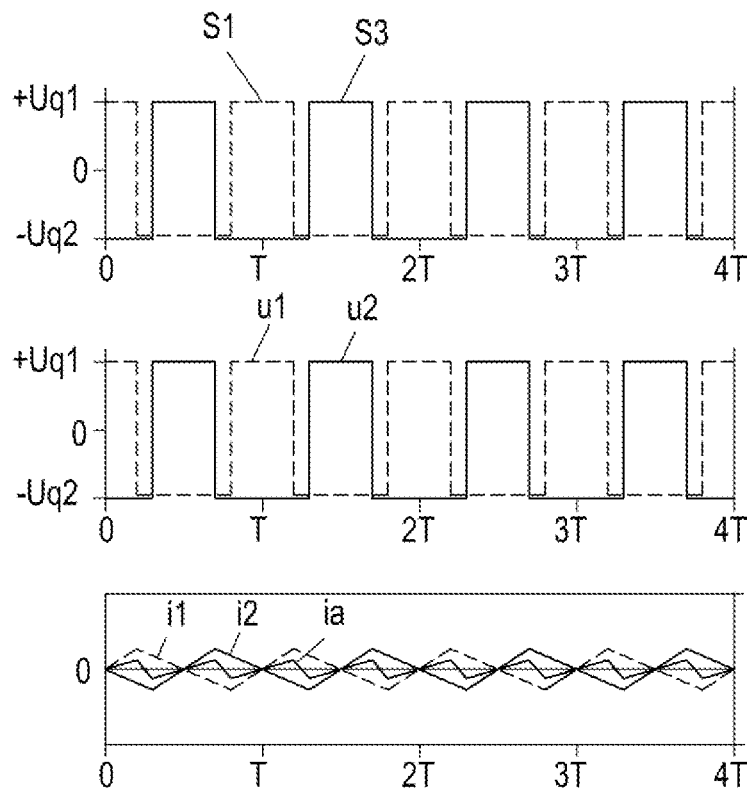
Figure 5A:
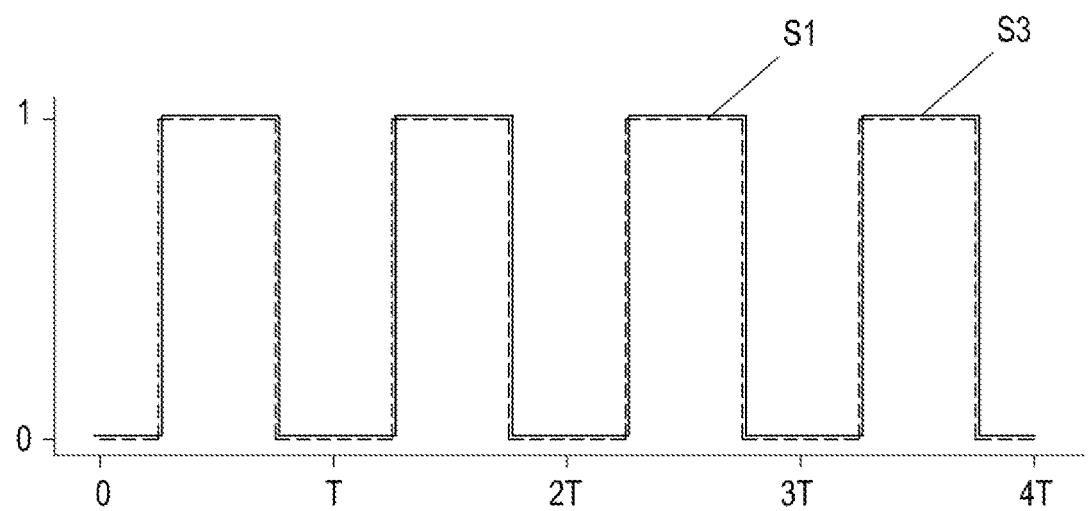
Figure 5A:
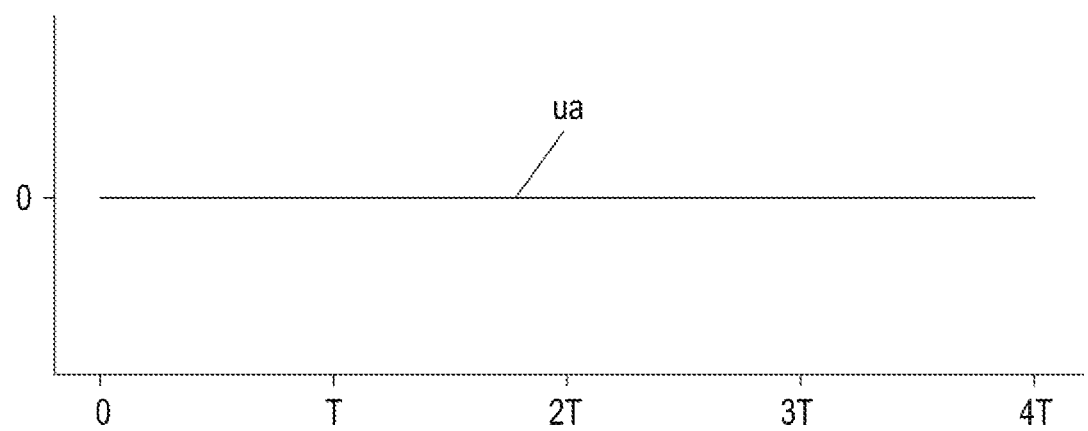
Figure 5B:
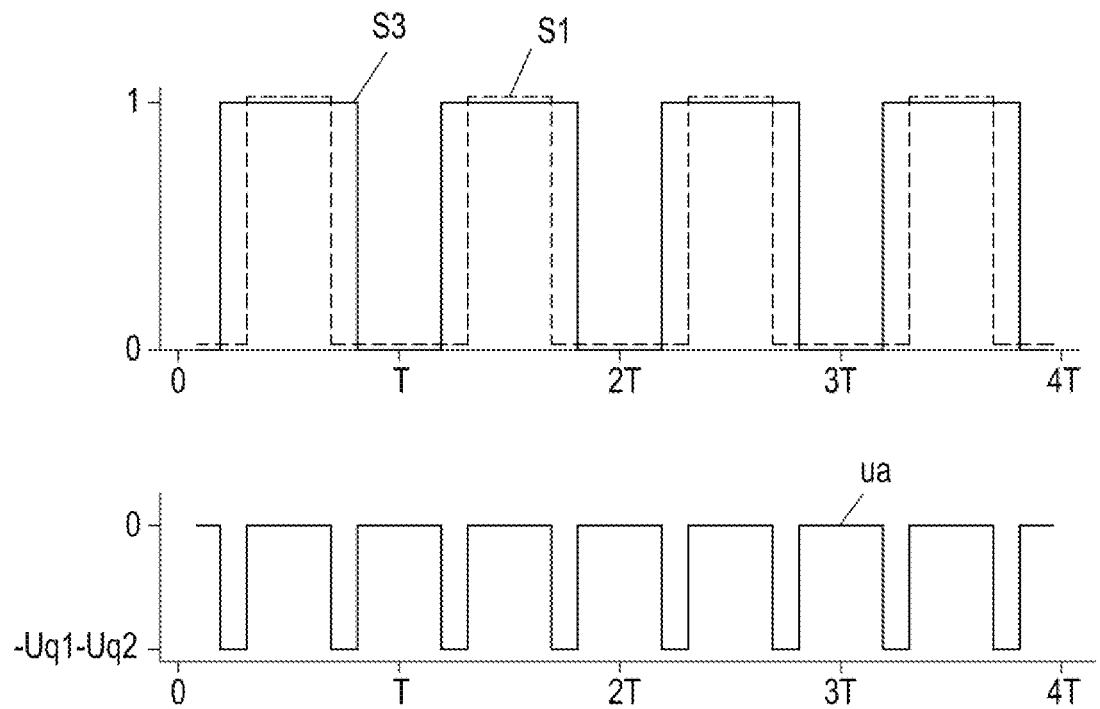
Figure 5C:
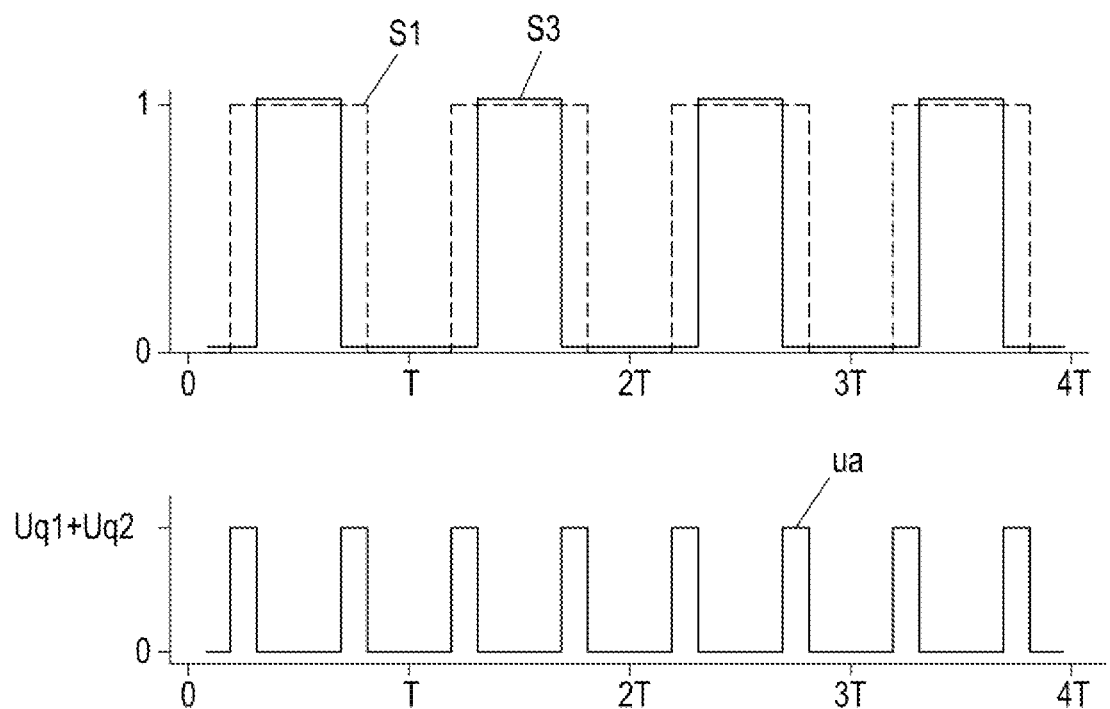

FIG. 3c shows the amplifier in the second operating mode with a filter inductor Lx at the output, FIG. 4a shows a test signal in the first operating mode at a duty cycle of 50%, FIG. 4b shows a test signal in the first operating mode at a duty cycle of 40%, FIG. 5a shows a test signal in the second operating mode at a duty cycle of 50%, FIG. 5b shows a test signal in the second operating mode at a duty cycle of 40%, FIG. 5c shows a test signal in the second operating mode at a duty cycle of 60%.

Figure 1B:
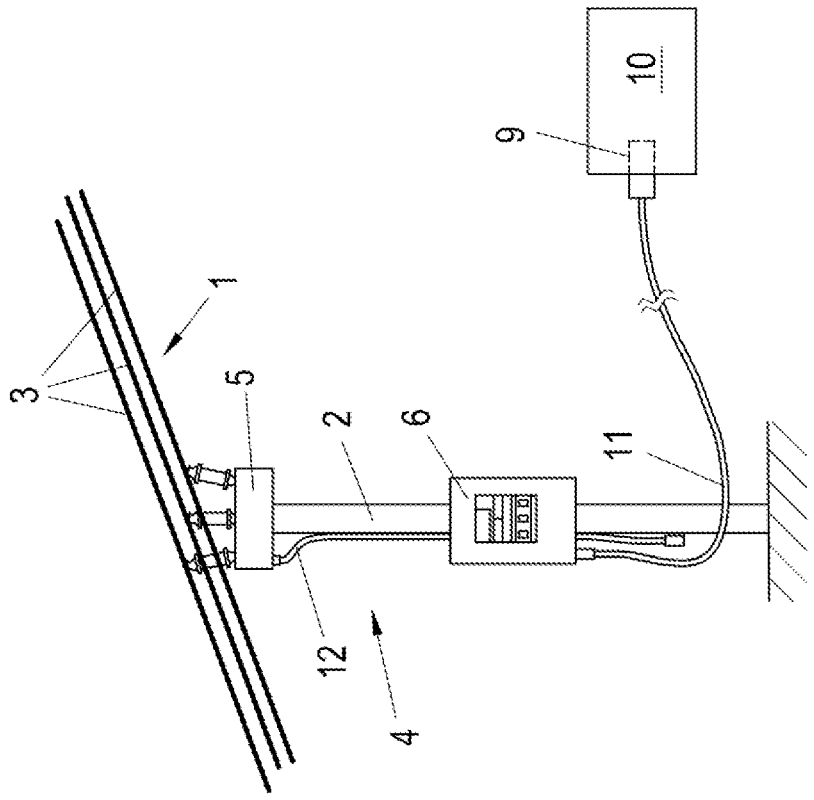
FIG. 1b shows a test device connected to the control unit.
Figure 1A:
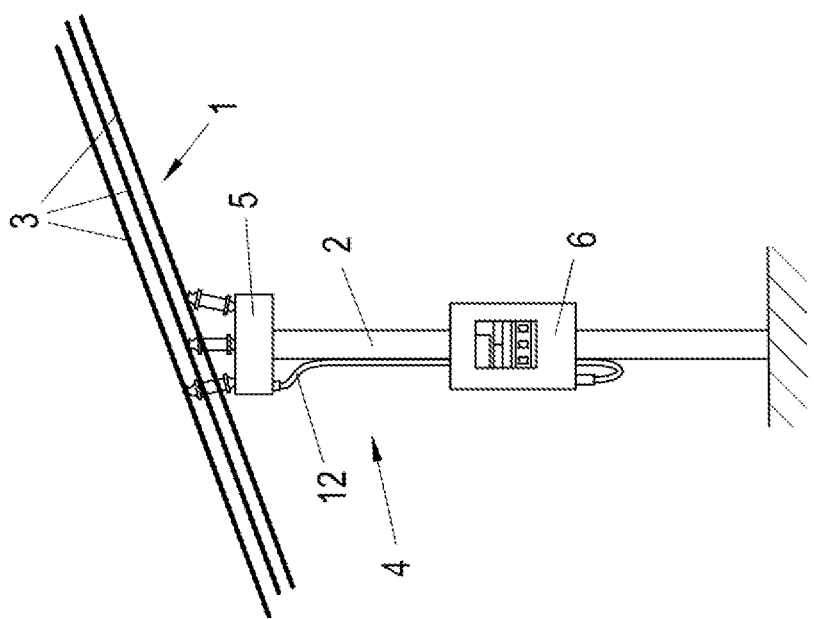
FIG. 1a shows an electrical switchgear having a control unit.

FIG. 1 shows a part of an electrical supply network 1—here, a three-phase overhead line, the lines 3 of which are tensioned in a conventional manner between masts 2. A switchgear 4, which consists of a switching device 5 and an associated control device 6, is provided on the mast as a safety device. The switching device 5 is, for example, in a known manner, a recloser or a circuit breaker in the form of a magnetic actuator, which includes a coil. The switching device 5 is capable of separating or connecting at least one of the lines 3 by a switching action triggered by the control device 6.

For this purpose, the switching device 5 is connected to the control device 6 via a control connection 12. For this purpose, the control connection 12 generally comprises a number of control lines for transmitting control input variables and control output variables. Switching actions are typically triggered by control output variables.

For testing the switchgear 4, the control connection 12 is disconnected between the switching device 5 and the control device 6, as shown in FIG. 1b. It is also possible that the switching device 5 is not connected to the control device 6 before the test, e.g., during initial start-up, at all, meaning that the disconnection of the control connection 12 can be omitted. This is quite frequently the case, since the control device 6 is often parameterized before an installation and then tested for function, using the test device 10, before being brought "into the field" and installed. For the purpose of testing, the control device 6 is connected, by means of an adapter cable 11, to a test device 10 which simulates the switching device 5, to test the correct functioning and parameterization of the control device 6 of the switchgear 4. One side of the adapter cable 11 is connected to the signal input of the control device 6, and the other side is connected to the signal output 9 of the test device 10. The test device 10 thus serves to imitate or simulate the switching device 5. Analog secondary variables of current and/or voltage converters can be simulated by the test device 10 and fed into the control unit 6 to detect the correct functioning of the control device 6 (for example, three-phase). Depending upon the fault type and fault characteristic, the control device 6 transmits a signal after a predetermined time—for example, by a binary contact, for separating at least one of the lines 3 to the test device 10. In this case, the test device 10 simulates the switching device 5. The generation of the secondary variables, which are fed into the control device 6, can take place by means of a test device 10 comprising an amplifier according to the invention. A test signal thus serves as a secondary variable.

A test device 10 comprising an amplifier 8 according to the invention is of course not limited to the application in an electrical supply network 1 in the form of an overhead line, but it rather can be used in any system for transmitting or distributing electrical energy, having safety devices in the form of a switchgear 4 having a switching device 5 and an associated control device 6. The amplifier 8 according to the invention can also be used in a test device 10 for testing an electrical component of an electrical switchgear, wherein the test signal is applied to the electrical component.

An amplifier 8 for a test device 10 for testing an electrical component—preferably a control device 6 of a switching device 5 of an electrical switchgear 4—is designed to output a test signal at a signal output between a positive output terminal P and a negative output terminal N. According to the invention, a switching unit 7 is provided in the amplifier 8, which switching unit is designed to selectively switch the amplifier 8 into a first operating mode Mi and into a second operating mode Mu.

The test signal is composed of a test current ia and a test voltage ua. In the first operating mode Mi, the test current ia of the test signal is preferably regulated; in the second operating mode Mu, the test voltage ua of the test signal is preferably regulated. FIG. 3 shows a preferred embodiment of the amplifier 8. In this case, a first half bridge HB1— preferably comprising a first switching element S1 and a second switching element S2 connected in series with the first switching element S1—and a second half bridge HB2— preferably comprising a third switching element S3 and a fourth switching element S4 connected in series with the third switching element S3—are provided.

The signal output is connected to a load Z—preferably to a low-impedance load Z in the first operating mode Mi and to a high-impedance load Z in the second operating mode Mu. A further electrical component, e.g., the control device 6 of the switching device 5 of the electrical switchgear 4 according to FIG. 1, can be regarded as the load L. In the first operating mode Mi, the first half bridge HB1 and the second half bridge HB2 are connected in parallel to the signal output; in the second operating mode Mu, the first half bridge HB1 and the second half bridge HB2 are connected in series with the signal output. In the exemplary embodiment shown, the amplifier 8 is provided with a first DC voltage source UQ1 having a first DC voltage Uq1, and a second DC voltage source UQ2 connected in series via a connection point V and having a second DC voltage Uq2. The first half bridge HB1 and the second half bridge HB2 are also each connected in parallel to the series-connected first and second DC voltage sources UQ1, UQ2, wherein a connection point of the first switching element S1 and the second switching element S2 forms a first center point M1, and a connection point of the third switching element S3 and the fourth switching element S4 forms a second center point M2. In addition, the first center point M1 is connected to the positive output terminal P, which can be done directly, or via further elements. In particular, line filter inductors L' can be provided as further elements. This is the case in FIG. 2 (and also FIGS. 3a, b, c) since an optional line filter inductor L' is provided between the first center point M1 and the positive output connection P. An optional line filter inductor L' is also provided in FIG. 2 (and FIGS. 3a, b, c) between the second center point M2 and the negative output terminal N. In addition, the line filter inductors L' are each connected to ground potential via optional line filter capacitors C. If the line filter inductors L' are omitted and line filter capacitors C are nevertheless provided, then the first and second center points M1, M2 are each connected to ground potential via the line filter capacitors C.

Furthermore, a filter inductor L is provided at the signal output, the inductance of which inductor can be switched or bridged by a second switch R2. Preferably, in the first operating mode M1, the filter inductor L is bridged by the second switch R2. However, an optional third switch R3 is also provided, which serves to reconnect the filter inductor L in the second operating mode Mu. Of course, the filter inductor L in the second operating mode can also be switched on by a further switch (not shown), which is designed separately from the second switch R2.

If a filter inductor L is connected in the second operating mode Mu, a low-impedance load Z can also be connected to the signal output. If it is assumed that the amplifier 8 can output a test signal having a test current is of 1A, in the second operating mode Mu, a load Z of 300 ohms can for example be provided at the signal output, since the voltage sources UQ1 and UQ2 provide a sufficiently high DC voltage Uq1, Uq2 for driving this load.

Figure 2:
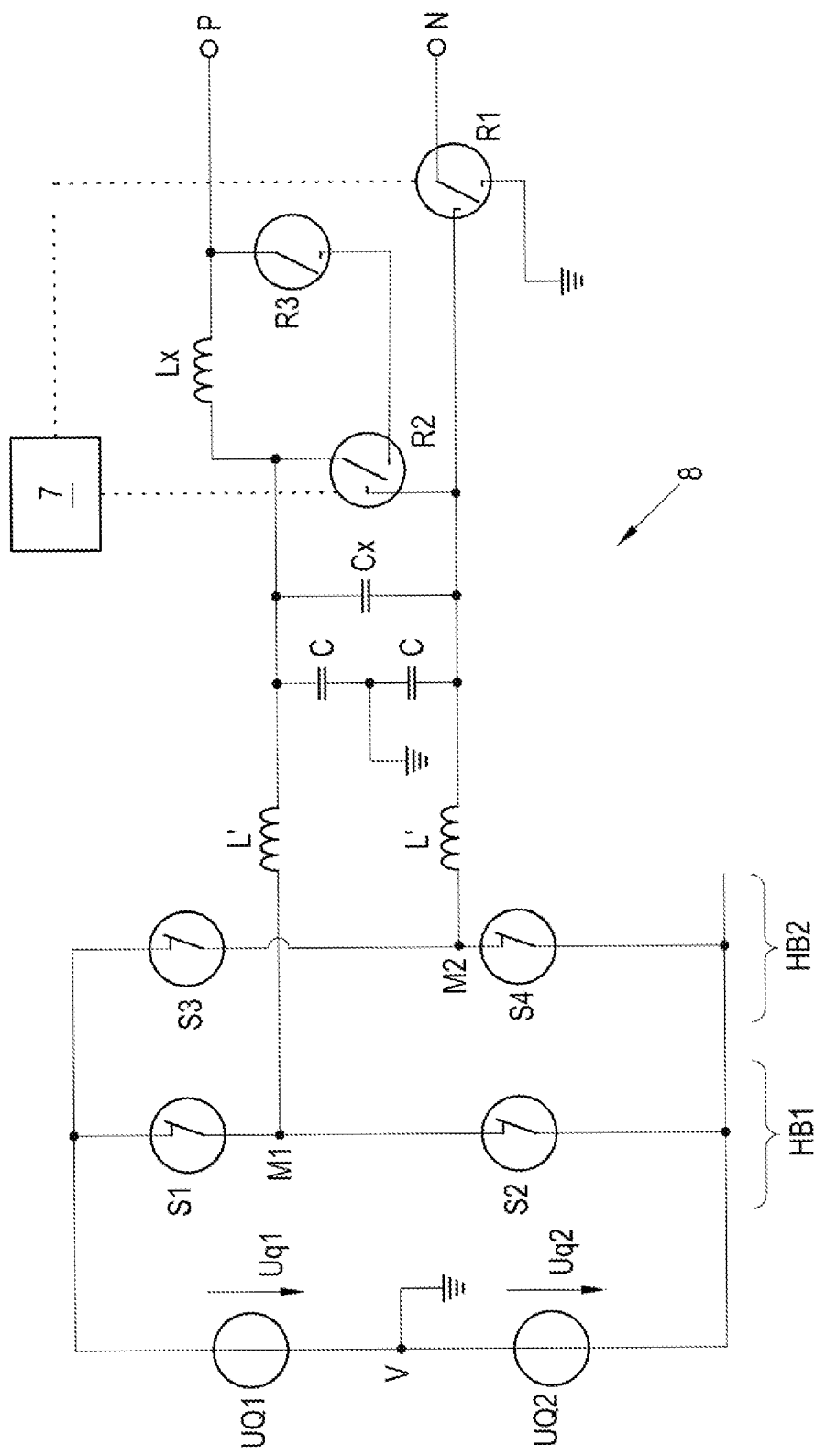
FIG. 2 shows an embodiment of the amplifier.

Furthermore, in FIG. 2, an optional filter capacitor Cx is provided between the positive output terminal P and the negative output terminal N. In the embodiment shown, the second switch R2 also serves, in the second operating mode Mu, to switch a filter capacitor Cx between the positive output connection P and the negative output connection N, and, in the first operating mode Mi, to bridge the filter capacitor Cx.

The first switch R1 and/or the second switch R2 and/or the third switch R3 and/or further switches can be controlled by the switching unit 7. The filter inductor Lx is thus located between the first center point M1 and the positive output terminal P (as shown in the figures).

It is also conceivable that the filter inductor Lx is arranged between the second center point M2 and the negative output terminal N. A filter inductor Lx can also be provided, in each case, between the first center point M1 and the positive output terminal P, and between the second center point M2 and the negative output connection N. In the first operating mode Mi, the second center point M2 is separated from the negative output terminal N, and the connection point V is connected to the negative output terminal N, in order to connect the first half bridge HB1 and the second half bridge HB2 in parallel with the signal output, and to output a test signal having a high test current ia at the signal output.

Instead, it could also be possible, in the first operating mode Mi, for the first center point M1 to be disconnected from the positive output terminal P, wherein the connection point V is connected to the positive output terminal P in order to connect the first half bridge HB1 and the second half bridge HB2 in parallel with the signal output, and, at the signal output, to output a test signal having a high test current ia. In this case, it is advantageous, if a filter inductor Lx is provided between the second center point M2 and the negative output connection N.

Switching of the connection of the second center point M2 from the negative output terminal N to the connection point V and vice versa (or, optionally, the first center point M1 from the negative output terminal N to the connection point V and vice versa) is preferably performed by a first switch R1, which is controlled, for example, by the switching unit 7, wherein, in the embodiment shown, the connection point V is connected to ground potential, and the first switch R1 separates the negative output terminal N from the second center point and connects it to ground potential.

In the second operating mode Mu, the second center point M2 is connected to the negative output terminal N and separated from the connection point V (which here also takes place via the first switch R1) in order to connect the first half bridge HB1 and the second half bridge HB2 in series and to output a test signal having a high-test voltage ua at the signal output.

Of course, this embodiment of the first switch R1, which implements two functions (separating the negative output connection N from the second center point M2, as well as switching the second center point M2 to ground potential), as well as the embodiment of the second switch R2, which likewise implements a plurality of functions (connection/bridging of the filter inductor Lx and connection of the first and second center points M1, M2) is in each case a preferred embodiment. Instead, it is also possible, for example, for one switch in each case to be provided for each function, e.g., a switch for connecting (or switching) the filter inductor Lx, a switch for connecting the first and second center points M1, M2, a switch for connecting the filter capacitor Cx, a switch for disconnecting the second center point M2 from the negative output terminal, a switch for switching the second center point M2 to ground, or any combination thereof.

FIG. 3a shows the wiring of the amplifier 8 from FIG. 2 in the first operating mode Mi. The first switch R1 (not shown) connects the negative output terminal N to the connection point V (i.e., here switches both the negative output terminal N and the connection point V to ground) and separates the output terminal N from the second center point M2.

In the first operating mode Mi, the second switch R2 (not shown) switches the half bridges HB1, HB2 in parallel, likewise here bridges the filter capacitor Cx, and connects the first center point M1 to the second center point M2 (in each case via the coils L'). The second switch R2 is in a position in which the filter inductor Lx is switched between the first center point M1 and the positive output terminal P. The third switch R3 is open, in order not to bridge the filter inductor Lx. The parallel connection of the half bridges HB1, HB2 makes it possible for the test current ia of the test signal to be doubled in the first operating mode Mi, at the signal output. If, for example, switching elements S1, S2, S3, S4 (for example, designed as transistors) used in the half bridges HB1, HB2 can each withstand 15 A, an output of a test signal having a high test current ia, e.g., in the region of 30A, is possible by means of a parallel connection of two half bridges HB1, HB2. If further half bridges are connected in parallel to the two half bridges HB1, HB2, a test signal having an even higher test current ia can be generated.

The first switching element S1 and the second switching element S2 of the first half bridge HB1 each switch alternately, and, likewise, the third switching element S3 and the fourth switching element S4 of the second half bridge HB2 switch alternately in each case. If the first switching element S1 is active, the second switching element S2 is inactive, and vice versa. Likewise, the third switching element S3 is active when the fourth switching element S4 is inactive, and vice versa. The duty cycle is known to describe the ratio of the control signals of the switching elements S1, S2, S3, S4 of a half bridge HB1, HB2, i.e., here, the ratio of the control signals of the first switching element S1 to the second switching element S2 for the first half bridge HB1, and the ratio of the control signals of the third switching element S3 to the fourth switching element S4 for the second half bridge HB2. Preferably, the first half bridge HB1 and the second half bridge HB2 are controlled with the same duty cycle. The control signals are generated by a pulse generation unit. The switching unit 7 is preferably an integral component of the pulse generation unit.

In the first operating mode Mi, the first half bridge HB1 and the second half bridge HB2 are preferably actuated in a manner offset by 180°, with the result that, for half bridge output currents i1, i2 provided by the half bridges HB1, HB2, (triangular) ripple currents result in each case, which are shifted by 180° with respect to one another. The test current ia of the test signal results from the sum of the half bridge output currents i1, i2. In this case, at a duty cycle of 50%, the ripple currents of the two half bridge output currents i1, i2 cancel out. At duty cycles not equal to 50%, the ripple currents of the half bridge output currents i1, i2 do not cancel out completely, but partially. In FIG. 3a, the test current ia of the test signal is regulated in the first operating mode Mi.

In the top graph, FIG. 4a shows, for the first operating mode Mi, by way of example, the control signals for the first switching element S1 and the third switching element S3 having a duty cycle of 50% and shifted by 180° relative to one another. The sole purpose of the depicted slight offset of the control signals is to be able to optically distinguish the overlapping control signals in the figures from one another. A switching period T is provided for the control signal. Accordingly, the resulting voltage signal u1 at the first center point M1 and the resulting voltage signal u2 at the second center point M3 are shown in the middle graph. In turn, the voltage signals u1, u2 result in the first half bridge output current i1 in the line filter inductor L' connected to the first center point M1, and the second half bridge output current i2 in the line filter inductor L' connected to the second center point M2. This results in the test current ia of the test signal as total current from the half bridge output currents i1, i2, wherein no ripple current occurs in the test signal in the case shown in FIG. 5a.

FIG. 4b shows the control signals for the first switching element S1 and the second switching element S3 having a duty cycle of 40% (once again shifted by 180° with respect to one another). The ripple current of the test current ia is no longer zero here, but has a double frequency compared to the frequency of the control signals, wherein the amplitude of the ripple current is also attenuated.

FIG. 3b shows the wiring of the amplifier 8 from FIG. 2 in the second operating mode Mu. The first switch R1 (not shown) connects the negative output terminal N to the second center point M2 and separates the negative output terminal N from the connection point V (i.e., here, from ground). In addition, in this case, in the second operating mode Mu, the filter capacitor Cx is connected between the positive output terminal P and the negative output terminal N, since the second switch R2 does not bridge the filter capacitor Cx. However, in this case, the second switch R2 bridges the filter inductor Lx. In FIG. 3b, the test voltage ua of the test signal is regulated in the second operating mode Mu.

FIG. 3c also shows the second operating mode Mu, which, however, differs from the second operating mode Mu according to FIG. 4b in that the third switch R3 is open and ensures that the filter inductor Lx is not bridged. In FIG. 3c, the test current ia of the test signal is regulated in the second operating mode Mu. It is thus possible, in the second operating mode Mu, to output a test current having a high signal quality and robust control behavior at low-impedance and also high-impedance loads Z.

Of course, it is also possible, but not shown in the figures, to regulate the test voltage in the first operating mode Mi. The following table briefly describes which figures show which operating modes Mi, Mu and which control types (control of test current ia, control of test voltage ua):

|  | First operating mode Mi | Second operating mode Mu |
| --- | --- | --- |
| Control of test current ia | FIG. 3a | FIG. 3c |
| Control of the test voltage ua | (not shown) | FIG. 3b |

FIG. 5a shows the control signals for the first switching element S1 and the second switching element S2 in the second operating mode Mu. The function of the slight offset of the control signals shown is to be able to optically distinguish the control signals in the figures from one another. FIG. 5a shows a duty cycle of 50%, which means that the control signals are in phase with one another. The half bridge output voltages u1, u2 at the first and second center points M1, M2 have the same shape as the control signals, as a result of which the current ripple of the coil currents flowing through the line filter inductor L' is compensated for. The voltage signal ua results from the difference between the half bridge voltages u1 u2, as a result of which, in the case shown, no voltage ripple occurs, but a test voltage ua of zero is established.

FIG. 5b shows a duty cycle of 40%, whereas, in FIG. 5c, a duty cycle of 60% is shown. This results in a test voltage ua (again from the difference between the half bridge voltages u1, u2) which is of twice the frequency of the control signals. In this way, overall, the current ripples of the coil currents flowing through the line filter inductor L' half cancel each other out, as a result of which, and subsequently, by the double frequency of the control signals, the voltage ripple of the test voltage ua at the filter capacitor Cx is halved.

The invention claimed is:

1. An amplifier for a test device for testing an electrical component, the amplifier being designed to output a test signal at a signal output between a positive output terminal and a negative output terminal, and comprising:
    a first half bridge, which has a first switching element and a second switching element connected in series via a first center point,
    a second half bridge, which has a third switching element and a fourth switching element connected in series via a second center point, and
    a switching unit operable to output the test signal to the electrical component being tested in a first operating mode and a second operating mode,
    wherein, in the first operating mode, the first center point of the first half bridge is connected to the second center point of the second half bridge and to one of the output terminals of the signal output,
    wherein, in the second operating mode, each of the first center point of the first half bridge and the second center point of the second half bridge is connected to a respective one of the output terminals of the signal output,
    wherein, in the first operating mode, the first half bridge is controllable with control signals that are phase-shifted by 180° with respect to control signals for controlling the second half bridge, and
    wherein, in the second operating mode, the first half bridge and the second half bridge are controllable with in-phase control signals.

2. The amplifier according to claim 1, further comprising a first DC voltage source and a second DC voltage source connected in series via a connection point,
    wherein the first half bridge and second half bridge are connected in parallel to the series-connected first and second DC voltage sources.

3. The amplifier according to claim 2, wherein, in the first operating mode, the first center point and the second center point are connected to the positive output terminal, and the connection point is connected to the negative output terminal.

4. The amplifier according to claim 1, wherein, in the second operating mode, the first center point is connected to the positive output terminal, and the connection point is disconnected from the second center point and connected to the negative output terminal.

5. The amplifier according to claim 4, wherein, in the second operating mode, the second center point is connected to the negative output terminal by a first switch which is actuated by the switching unit.

6. The amplifier according to claim 1, further comprising a filter capacitor, which is switchable between the positive output terminal and the negative output terminal.

7. The amplifier according to claim 1, further comprising a filter inductor at the signal output, which is switched and/or bridged.

8. A test device for testing electrical components, comprising:
    an amplifier according to claim 1, which outputs the test signal for testing the electrical components.

9. The amplifier according to claim 6, wherein a filter capacitor is switchable between the positive output terminal and the negative output terminal in the second operating mode.

10. The amplifier according to claim 7, wherein the filter inductor is switched and/or bridged by the switching unit.

* * * * *